(12) United States Patent
Lin et al.

(10) Patent No.: US 7,332,392 B2
(45) Date of Patent: Feb. 19, 2008

(54) TRENCH-CAPACITOR DRAM DEVICE AND MANUFACTURE METHOD THEREOF

(75) Inventors: Yung-Chang Lin, Tai-Chung Hsien (TW); Sun-Chieh Chien, Hsin-Chu (TW); Chien-Li Kuo, Hsin-Chu (TW); Ruey-Chyr Lee, Tai-Chung (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/279,254

(22) Filed: Apr. 11, 2006

(65) Prior Publication Data
US 2007/0238244 A1    Oct. 11, 2007

(51) Int. Cl.
*H01L 21/8242* (2006.01)

(52) U.S. Cl. .............. 438/243; 438/386; 257/E29.346; 257/E21.396

(58) Field of Classification Search ........ 438/243–246, 438/248, 386, 387, 142, 197, 238, 239; 257/301, 257/302, 304, E27.092, E27.095, E21.396, 257/E21.657, E29.346; 27/E29.396
See application file for complete search history.

(56) References Cited

U.S. PATENT DOCUMENTS

| | | | |
|---|---|---|---|
| 4,833,094 A | 5/1989 | Kenney | |
| 4,855,952 A | 8/1989 | Kiyosumi | |
| 4,873,560 A | 10/1989 | Sunami et al. | |
| 4,916,511 A | 4/1990 | Douglas | |
| 4,918,502 A * | 4/1990 | Kaga et al. | 257/304 |
| 4,921,815 A | 5/1990 | Miyazawa | |
| 5,315,543 A | 5/1994 | Matsuo et al. | |
| 5,468,979 A | 11/1995 | Tani et al. | |
| 5,555,520 A | 9/1996 | Sudo et al. | |
| 5,798,545 A | 8/1998 | Iwasa et al. | |
| 2007/0015327 A1* | 1/2007 | Su | 438/244 |

* cited by examiner

*Primary Examiner*—Brook Kebede
(74) *Attorney, Agent, or Firm*—Winston Hsu

(57) ABSTRACT

A trench capacitor structure includes a semiconductor substrate comprising thereon a STI structure. A capacitor deep trench is etched into the semiconductor substrate. Collar oxide layer is disposed on inner surface of the capacitor deep trench. A first doped polysilicon layer is disposed on the collar oxide layer and on the exposed bottom of the capacitor deep trench. A capacitor dielectric layer is formed on the first doped polysilicon layer. A second doped polysilicon layer is formed on the capacitor dielectric layer. A deep ion well is formed in the semiconductor substrate, wherein the deep ion well is electrically connected with the first doped polysilicon layer through the bottom of the capacitor deep trench. A passing gate insulation (PGI) layer is formed on the second doped polysilicon layer and on the STI structure.

19 Claims, 11 Drawing Sheets

TRENCH-CAPACITOR DRAM DEVICE AND MANUFACTURE METHOD THEREOF

BACKGROUND OF THE INVENTION

1. Field of the Invention

The present invention relates generally to semiconductor devices, and more particularly, to a deep trench capacitor of a dynamic random access memory (DRAM) cell and manufacture method thereof.

2. Description of the Prior Art

A memory cell of a DRAM is composed of a metal oxide semiconductor (MOS) transistor connected to a capacitor. The MOS transistor comprises a gate, and a first and second doped regions. The doped regions are used as a source or a drain depending on the operational situation of the MOS transistor. The MOS transistor functions by using the gate electrically connected to a word line as a switch, using the source electrically connected to a bit line as a current transporting path, and using the drain electrically connected to a storage node of the capacitor to complete data accessing.

The capacitor, composed of a top electrode, a capacitor dielectric layer and a storage node, is formed on a silicon oxide layer over a substrate. In a present DRAM process, the capacitor is designed as either a stack capacitor stacked on the substrate or a deep trench capacitor buried within the substrate.

Please refer to FIG. 1 to FIG. 6. FIGS. 1-6 are schematic, cross-sectional diagrams showing a method of fabricating a DRAM deep trench capacitor according to the prior art method. As shown in FIG. 1, a pad stack 14 composed of a silicon nitride layer and a pad oxide layer is formed on a substrate 12 of a semiconductor wafer. A photoresist layer (not shown) is formed on the surface of the pad stack 14. Next, a photolithographic process and etching process are performed to form an opening 16 in the pad stack 14 to define the position of the deep trench.

As shown in FIG. 2, an etching process is performed using the pad stack 14 as a mask to etch the opening 16 down to the substrate 12 to form a deep trench 18 with a depth of 7~8 micrometers (μm). Subsequently, an arsenic silicate glass (ASG) diffusion method is used to form a N-doped buried plate 20 as a top plate of the capacitor within the substrate 12 and beneath the deep trench 18.

As shown in FIG. 3, a chemical vapor deposition (CVD) process is performed to form a silicon nitride layer (not shown) on the surface of the deep trench 18. Next, a thermal oxidation process is performed to grow an oxide layer (not shown) on the silicon nitride layer, so that the silicon nitride layer together with the oxide layer form a capacitor dielectric layer 22. Next, a N-doped polysilicon layer 24 is deposited into and completely fills in the deep trench 18, to function as a primary conductor of the storage node. A planarization process, such as a chemical mechanical polishing (CMP) or an etching back process, is performed using the pad stack 14 as a stop layer to remove portions of the doped polysilicon layer 24 and align its surface with the pad stack 14.

As shown in FIG. 4, a first polysilicon recess etching process is performed to etch the doped polysilicon layer 24 down to the surface of the substrate 12. A wet etching process is then performed, using phosphoric acid ($H_3PO_4$) as the etching solution, to remove about half the depth of the capacitor dielectric layer 22 so as to expose the area of the substrate 12 in the upper region of the deep trench 18.

As shown in FIG. 5, another thermal oxidation process is performed to form a pair of collar oxides 26, with a thickness of 200~300 angstroms, on the exposed substrate 12 in the upper region of the deep trench 18. A N-doped polysilicon layer 27 is deposited on the surface of the semiconductor wafer and fills in the deep trench 18, followed by a planarization process to remove portions of the doped polysilicon layer 27 and approximately align the surface of the doped polysilicon layer 27 with that of the pad stack 14. A second polysilicon recess etching process is performed to etch back portions of the doped polysilicon layer 27 and lower the surface of the remaining doped polysilicon layer 27 down to the surface of the collar oxides 26.

As shown in FIG. 6, an etching process is performed to remove portions of the collar oxides 26 so as to expose the substrate 12 in the deep trench 18. A CVD process is then performed to deposit an polysilicon layer 28 on the semiconductor wafer. Next, a planarization process is performed using the pad stack 14 as a stop layer to remove portions of the polysilicon layer 28 and approximately align the surface of the remaining polysilicon layer 28 with that of the pad stack 14. A third polysilicon recess etching process is performed to etch back the polysilicon layer 28 and lower its surface down to the pad stack 14. Finally, the pad stack 14 is completely removed to finish the fabrication of the storage node.

In the prior method, a phase-in polysilicon filling is used to fabricate the storage node, which requires a three-time repeated operational cycle of deposition, planarization and recess etching processes. Thus, it not only complicates the fabrication process but also increases both production cost and time. In addition, the prior art trench-capacitor DRAM device has a drawback in that so-called trench induced junction leakage adversely affects data storage and reliability.

SUMMARY OF THE INVENTION

It is therefore an objective of the present invention to provide a method for fabricating a deep trench capacitor in order to simplify the production process and to solve the above-mentioned problems.

According to the claimed invention, a method for fabricating a trench-capacitor dynamic random access memory (DRAM) device is disclosed. A semiconductor substrate having thereon a shallow trench isolation (STI) structure is provided. A pad oxide layer and a pad nitride layer are formed over the semiconductor substrate. A capacitor deep trench is etched into the pad nitride layer, pad oxide layer and the semiconductor substrate. A collar oxide layer is formed on inner surface of the capacitor deep trench. The collar oxide layer at a bottom of the capacitor deep trench is etched away to expose the bottom. A conformal first doped polysilicon layer is deposited on the collar oxide layer and on the bottom of the capacitor deep trench. The first doped polysilicon layer acts as a capacitor bottom electrode. A capacitor dielectric layer is formed on the first doped polysilicon layer. A second doped polysilicon layer is formed on the capacitor dielectric layer. The second doped polysilicon layer fills the capacitor deep trench and the second doped polysilicon layer acts as a capacitor top electrode. The pad nitride layer is stripped. An ion implantation process is performed to form a deep ion well in the semiconductor substrate. The deep ion well is electrically connected with the first doped polysilicon layer through the bottom of the capacitor deep trench. A passing gate insulation (PGI) layer is formed on the second doped polysilicon layer and on the STI structure.

From one aspect of this invention, a trench capacitor structure is provided. The trench capacitor structure includes a semiconductor substrate comprising thereon a shallow trench isolation (STI) structure. A capacitor deep trench is etched into the semiconductor substrate. A collar oxide layer is disposed on inner surface of the capacitor deep trench, wherein the collar oxide layer has opening at bottom of the capacitor deep trench to expose the bottom of the capacitor deep trench. A first doped polysilicon layer is disposed on the collar oxide layer and on the exposed bottom of the capacitor deep trench, wherein the first doped polysilicon layer acts as a capacitor bottom electrode. A capacitor dielectric layer is formed on the first doped polysilicon layer. A second doped polysilicon layer is formed on the capacitor dielectric layer, wherein the second doped polysilicon layer fills the capacitor deep trench and acts as a capacitor top electrode. A deep ion well is formed in the semiconductor substrate, wherein the deep ion well is electrically connected with the first doped polysilicon layer through the bottom of the capacitor deep trench. A passing gate insulation (PGI) layer is formed on the second doped polysilicon layer and on the STI structure.

These and other objectives of the present invention will no doubt become obvious to those of ordinary skill in the art after reading the following detailed description of the preferred embodiment that is illustrated in the various figures and drawings.

DETAILED DESCRIPTION

In general, the above-described prior art method for fabricating a trench capacitor of a DRAM device can be summarized as follows:

Phase 1: deep trench etching.
Phase 2: buried plate and capacitor dielectric formation.
Phase 3: first polysilicon deep trench fill and first recess etching.
Phase 4: collar oxide formation.
Phase 5: second polysilicon deposition and second recess etching.
Phase 6: third polysilicon deposition and third recess etching.
Phase 7: STI process.

It is disadvantageous to use the above-described prior art method for fabricating a trench capacitor of a DRAM device because the prior art processes are complicated and time-consuming.

Figure 1:
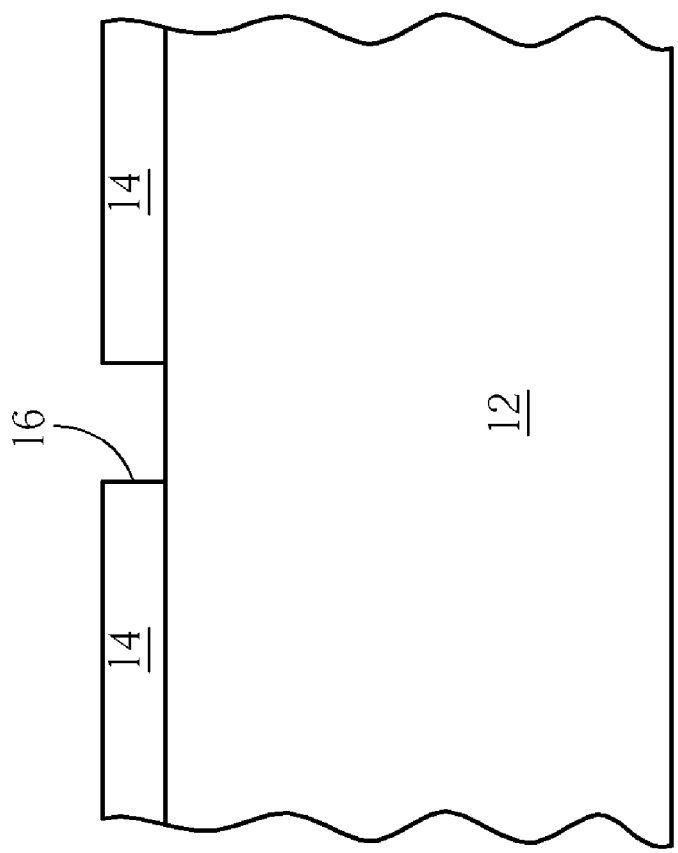
FIG. 1 to FIG. 6 are schematic, cross-sectional diagrams showing a method of fabricating a DRAM deep trench capacitor according to the prior art method.
Figure 2:
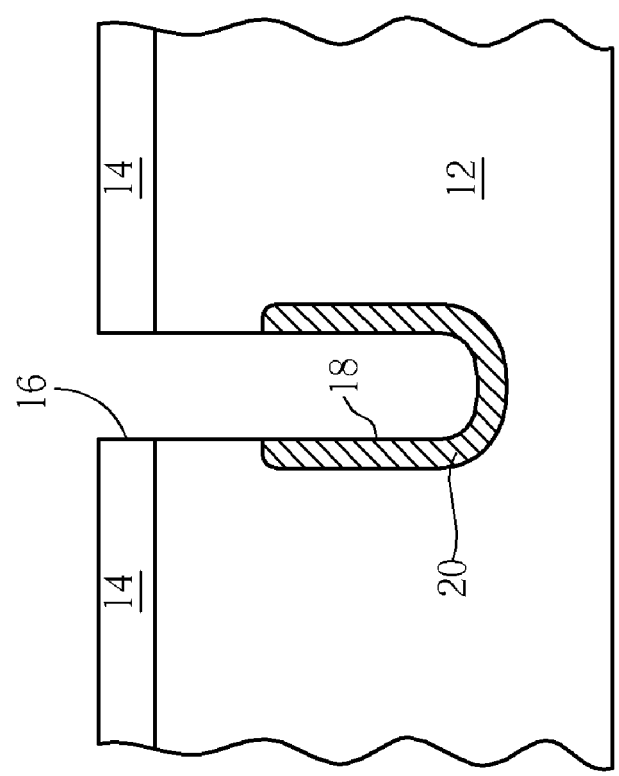
Figure 3:
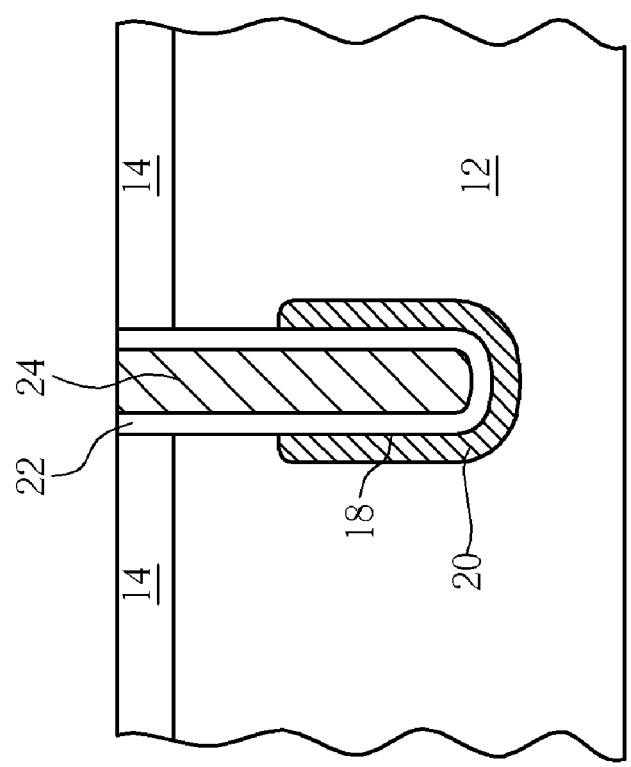
Figure 4:
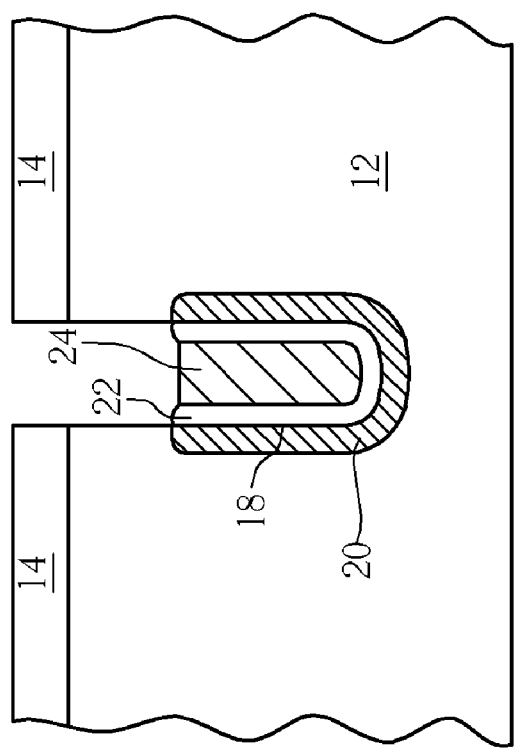
Figure 5:
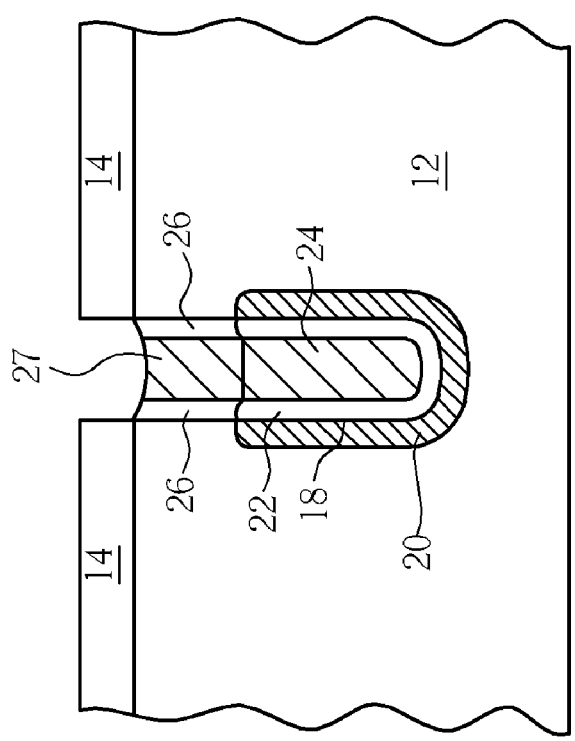
Figure 6:
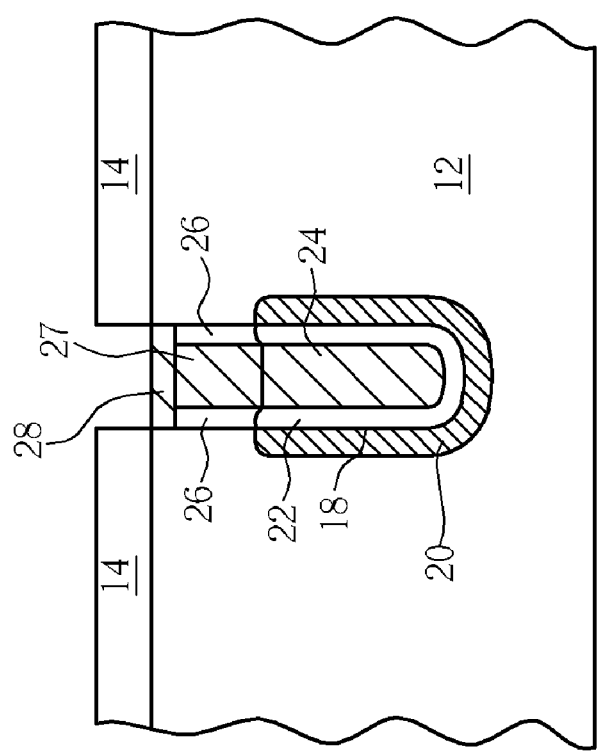
Figure 7:
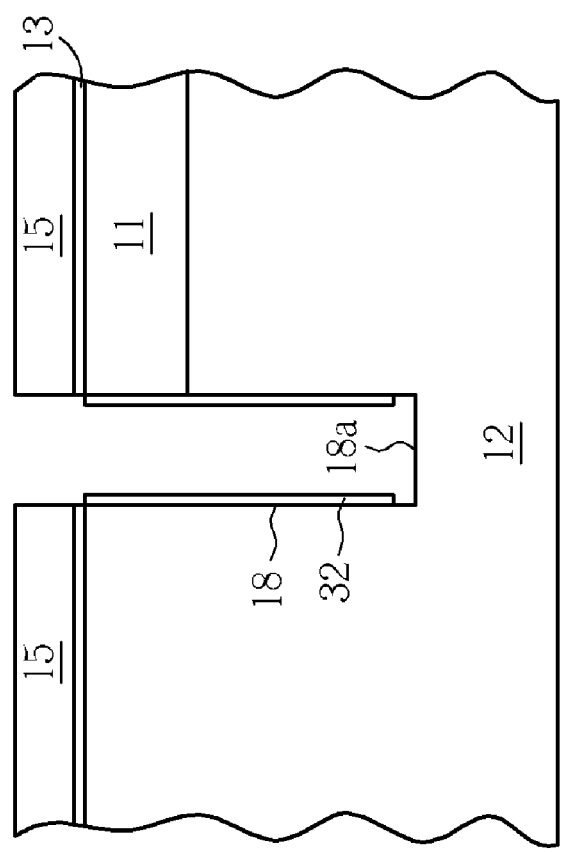
FIG. 7 to FIG. 11 are schematic, cross-sectional diagrams showing the preferred exemplary method of fabricating a trench-capacitor DRAM device in accordance with one preferred embodiment of this invention.

Please refer to FIG. 7 to FIG. 11. FIG. 7 to FIG. 11 are schematic, cross-sectional diagrams showing the preferred exemplary method of fabricating a trench-capacitor DRAM device in accordance with one preferred embodiment of this invention. As shown in FIG. 7, a semiconductor substrate 12 is provided. A conventional shallow trench isolation (STI) process is performed to form STI structures 11 within the semiconductor substrate 12. Thereafter, a pad oxide layer 13 and a pad nitride layer 15 are formed on the surface of the semiconductor substrate 12. A lithographic and etching process is then carried out to etch a capacitor deep trench 18 into the pad nitride layer 15, the pad oxide layer 13 and the semiconductor substrate 12.

A collar oxide layer 32 is then formed on inner surface of the capacitor deep trench 18. According to the preferred embodiment, the collar oxide layer 32 has a thickness of about 100~150 angstroms. The collar oxide layer 32 may be formed by in-situ silicon growth (ISSG) methods, but not limited thereto. First, the collar oxide layer 32 is formed on sidewall and bottom surface of the capacitor deep trench 18. An etching process such as an anisotropic dry etching process is carried out to etch away the collar oxide layer from the bottom surface of the capacitor deep trench 18, thereby exposing the bottom surface 18a of the capacitor deep trench 18.

Figure 8:
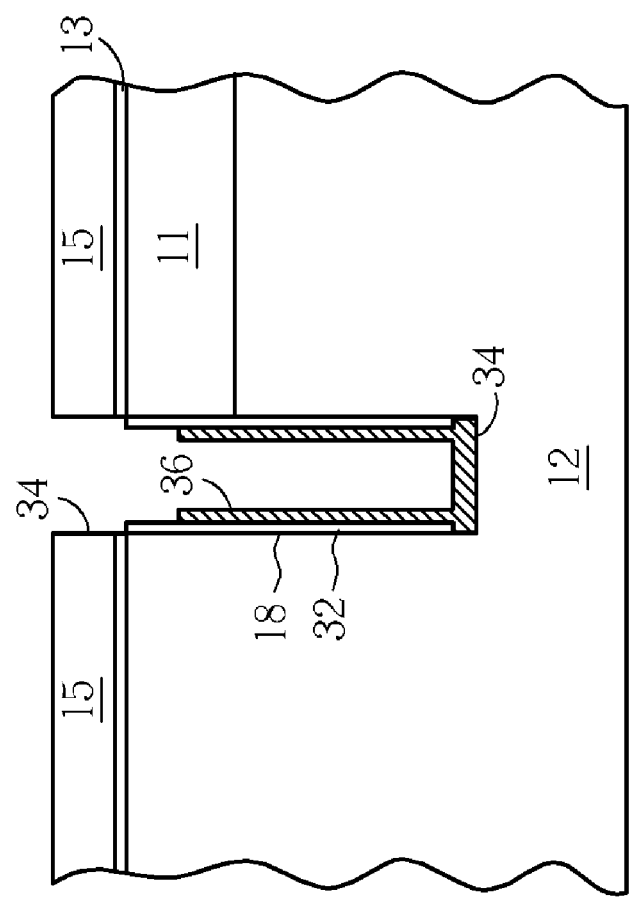

As shown in FIG. 8, a nitridation process is performed to form a thin nitride layer 34 at least on the bottom surface 18a of the capacitor deep trench 18. The thin nitride layer 34 has a thickness of about 5~10 angstroms, preferably 7 angstroms. Thereafter, a conformal doped polysilicon layer 36 having a thickness of about 120~180 angstroms, preferably 150 angstroms is deposited on the collar oxide layer 32 and on the thin nitride layer 34. The doped polysilicon layer 36 acts as a bottom electrode of the trench capacitor.

According to another preferred embodiment of this invention, after the deposition of the doped polysilicon layer 36, a surface rough process for increasing the surface of the capacitor bottom electrode is performed. For example, hemispherical silicon grains (HSG) may be formed on the doped polysilicon layer 36 to increase the capacitance.

According to the preferred embodiment, to form the profile of the doped polysilicon layer 36 as set forth in FIG. 8, the capacitor deep trench 18 is filled with a photoresist after the deposition of the doped polysilicon layer 36. The photoresist is etched back to a pre-selected depth within the deep trench to expose the upper portion of the doped polysilicon layer 36. Subsequently, an etching process such as wet etching is carried out to etch away the exposed doped polysilicon layer 36 that is not covered by the photoresist. The remaining photoresist is then removed. The top of the doped polysilicon layer 36 is about 1500 angstroms lower than the top of the deep trench 18.

Figure 9:
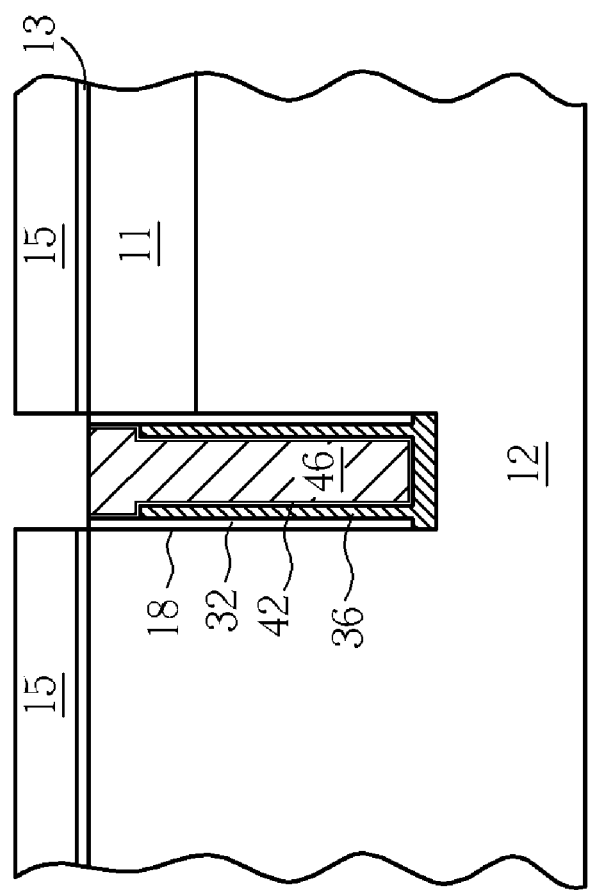

As shown in FIG. 9, an oxide-nitride-oxide (ONO) dielectric layer 42 is formed on the doped polysilicon layer 36 within the capacitor deep trench 18. According to the preferred embodiment, the ONO dielectric layer 42 has a thickness of about 40~60 angstroms, preferably 52 angstroms. A second polysilicon deposition process is carried out to deposit a doped polysilicon layer 46 on the semiconductor substrate 12. The doped polysilicon layer 46 fills the capacitor deep trench 18. Conventional chemical vapor deposition (CVD) such as LPCVD or PECVD may be used to deposit the doped polysilicon layer 46. Preferably, the thickness of the doped polysilicon layer 46 ranges between 3000 and 5000 angstroms, more preferably 4000 angstroms.

Subsequently, a planarization process such as a chemical mechanical polishing (CMP) is performed using the pad nitride layer 15 as a polishing stop layer to remove a portion of the doped polysilicon layer 46. After CMP, the surface of the doped polysilicon layer 46 is approximately coplanar with the surface of the pad nitride layer 15. Next, an etching process such as a plasma dry etching process is performed using the pad nitride layer 15 as a hard mask to recess the doped polysilicon layer 46. After the etching process, the surface of the doped polysilicon layer 46 is approximately coplanar with the surface of the semiconductor substrate 12.

The doped polysilicon layer 46 acts as a top electrode or storage node of the trench capacitor.

Figure 10:
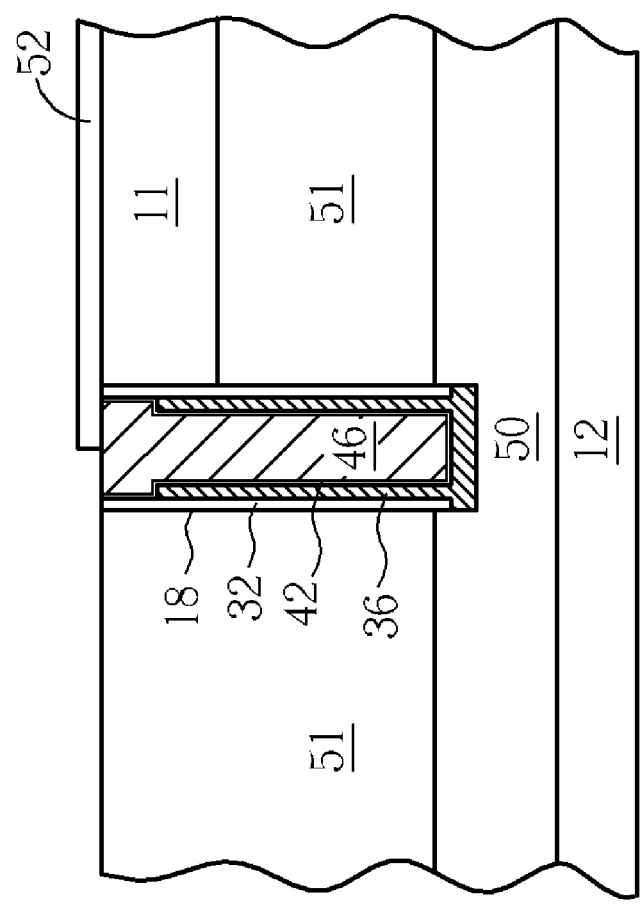

As shown in FIG. 10, the pad nitride layer 15 is removed from the surface of the semiconductor substrate 12. The pad nitride layer 15 may be removed by using conventional wet etching methods such as hot phosphoric acid solution or by using dry etching or vapor etching methods.

For example, the pad nitride layer 15 can be removed by using a gas mixture comprising hydrogen fluoride vapor and oxidizing agent such as $HNO_3$, $O_3$, $H_2O_2$, $HClO$, $HNO_2$, $O_2$, $H_2SO_4$, $Cl_2$, or $Br_2$ at properly controlled process temperatures. In still another case, the pad nitride layer 15 may be removed by using anhydrous hydrogen halogenide such as HF or HCl gas.

After removing the pad nitride layer 15, an ion implantation process is carried out to implant dopants such as phosphorous, arsenic or antimony into the semiconductor substrate 12 at a pre-selected depth for example, 6000~10000 angstroms to form a deep ion well 50. The deep ion well 50 is electrically connected with the doped polysilicon layer 36 by way of the open bottom 18a of the capacitor deep trench 18.

According to this invention, in operation, the deep ion well 50 is grounded, such that each doped polysilicon layer 36 or bottom electrode of each trench capacitor within the memory array is also grounded. By doing this, the induced depletion caused by the electrode within the capacitor trench and leakage current can be avoided.

According to the preferred embodiment, an array well implantation is performed to form an array well 51 within a memory array area. In operation, the array well 51 is also grounded.

Subsequently, a passing gate insulation (PGI) layer 52 is formed on the surface of the semiconductor substrate 12. The PGI layer 52 has a thickness of about 100~300 angstroms, preferably 150~200 angstroms. It is noted that the PGI layer 52 merely covers a portion of the doped polysilicon layer 46. To form the PGI layer 52, a conventional LPCVD method using (tetra-ethyl-ortho-silicate, TEOS) as a precursor may be employed to deposit a TEOS oxide layer over the semiconductor substrate 12. A lithographic and etching process is then carried out to etch away a portion of the TEOS oxide layer and expose a portion of the doped polysilicon layer 46.

Figure 11:
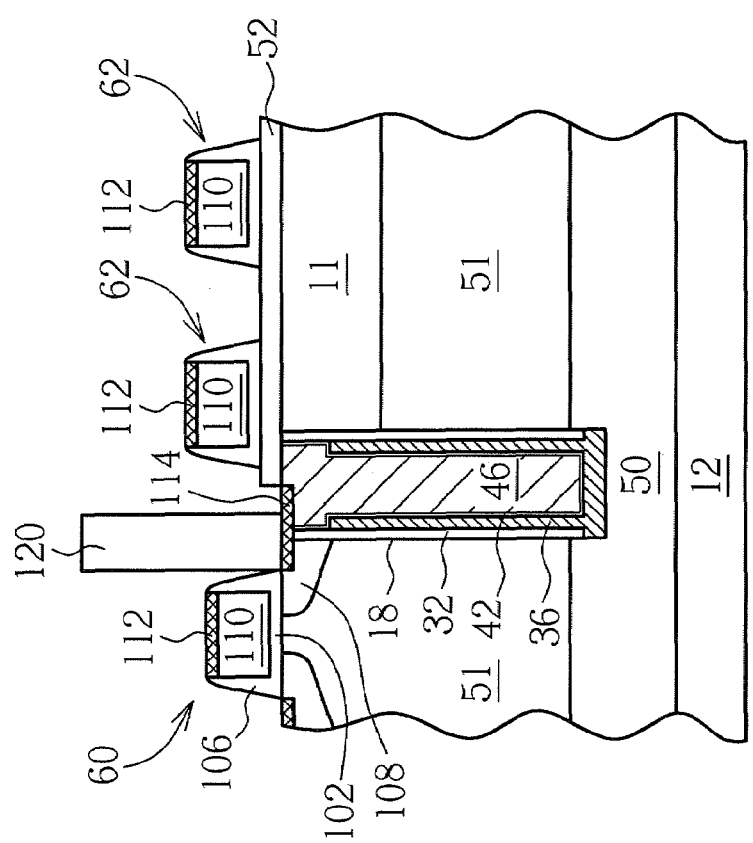

As shown in FIG. 11, after the formation of the PGI layer 52, an oxidation process is carried out to form a gate oxide layer 102 on the surface of the semiconductor substrate 12. A gate electrode 60 of a control transistor for control the trench capacitor and a passing gate 62 (or word line) are formed on the gate oxide layer 102 and on the PGI layer 52, respectively. Typically, each of the gate electrode 60 and passing gate 62 has a polysilicon layer 110 and sidewall nitride spacer 106.

After the formation of the gate electrode 60 and passing gate 62, an ion implantation process is performed using the gates and spacers as a hard mask to implant dopants such as phosphorous, arsenic or antimony into the semiconductor substrate 12, thereby forming source/drain doping regions 108 at two sides of the gate electrode 60.

Finally, a silicidation process is carried out to form a silicide layer 112 on the gate electrode 60 and passing gate 62, and a silicide layer 114 on the source/drain doping regions 108 and on the exposed doped polysilicon layer 46. The doped polysilicon layer 46 may be electrically connected with the source/drain doping regions 108 through the silicide layer 114. According to another preferred embodiment, the doped polysilicon layer 46 is electrically connected with the source/drain doping regions 108 through a share contact plug 120.

Compared to the prior art, the present invention features that the top electrode 46 and the bottom electrode 36 are both made of doped polysilicon. To form the trench capacitor, only two polysilicon process steps are required. The process flow is simplified.

Further, the capacitor deep trench has an open bottom 18a. Through the open bottom 18a, the bottom electrode 36 is electrically connected with the deep ion well 50. In operation, charge is stored inside the top electrode 46. The bottom electrode 36 is grounded by grounding the deep ion well 50 to prevent so-called trench induced junction leakage.

Furthermore, the present invention also features that the PGI layer 52 electrically isolates the word lines or passing gates from the trench capacitors, and that the source/drain doping region of the control transistor is electrically connected with the doped polysilicon layer 46 through the silicide layer 114 or through a share contact 120.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a trench-capacitor dynamic random access memory (DRAM) device, comprising:
   providing a semiconductor substrate having thereon a shallow trench isolation (STI) structure;
   forming a pad oxide layer and a pad nitride layer over the semiconductor substrate;
   etching a capacitor deep trench into the pad nitride layer, pad oxide layer and the semiconductor substrate;
   forming a collar oxide layer on inner surface of the capacitor deep trench;
   etching away the collar oxide layer at a bottom of the capacitor deep trench to expose the bottom;
   forming a conformal first doped polysilicon layer on the collar oxide layer and on the bottom of the capacitor deep trench, wherein the first doped polysilicon layer acts as a capacitor bottom electrode;
   forming a capacitor dielectric layer on the first doped polysilicon layer;
   forming a second doped polysilicon layer on the capacitor dielectric layer, wherein the second doped polysilicon layer fills the capacitor deep trench and the second doped polysilicon layer acts as a capacitor top electrode;
   stripping the pad nitride layer;
   performing an ion implantation process to form a deep ion well in the semiconductor substrate; and
   forming a passing gate insulation (PGI) layer on the second doped polysilicon layer and on the STI structure.

2. The method according to claim 1 wherein after the formation of the PGI layer, the method further comprises the following steps:
   etching away a portion of the PGI layer that covers the second doped polysilicon layer to expose a portion of the second doped polysilicon layer;
   forming a gate oxide layer on the semiconductor substrate;
   forming a gate electrode on the gate oxide layer;
   forming a spacer on sidewalls of the gate electrode;

forming a source doping region and a drain doping region at two sides of the gate electrode in the semiconductor substrate; and performing a silicidation process to form a silicide layer on the source doping region, drain doping region and on the exposed second doped polysilicon layer, wherein the second doped polysilicon layer is electrically connected with the drain doping region through the silicide layer.

3. The method according to claim 2 wherein after the silicidation process, the method further comprises the following step:

forming a share contact bridging the second doped polysilicon layer and the drain doping region to electrically connect the second doped polysilicon layer with the drain doping region.

4. The method according to claim 1 wherein the collar oxide layer is formed by in-situ silicon growth (ISSG) method.

5. The method according to claim 1 wherein the collar oxide layer has a thickness of 100~150 angstroms.

6. The method according to claim 1 wherein before the formation of the first doped polysilicon layer, the method further comprises the following step:

performing a nitridation process to form a nitride layer at least on the bottom of the capacitor deep trench.

7. The method according to claim 6 wherein the nitride layer has a thickness of 5~10 angstroms.

8. The method according to claim 1 wherein in operation the deep ion well is grounded.

9. The method according to claim 1 wherein the semiconductor substrate is a P type semiconductor substrate.

10. The method according to claim 1 wherein the deep ion well is an N well.

11. A trench capacitor structure, comprising:

a semiconductor substrate comprising thereon a shallow trench isolation (STI) structure;

a capacitor deep trench etched into the semiconductor substrate;

a collar oxide layer on inner surface of the capacitor deep trench, wherein the collar oxide layer has opening at bottom of the capacitor deep trench to expose the bottom of the capacitor deep trench;

a first doped polysilicon layer on the collar oxide layer and on the exposed bottom of the capacitor deep trench, wherein the first doped polysilicon layer acts as a capacitor bottom electrode;

a capacitor dielectric layer on the first doped polysilicon layer;

a second doped polysilicon layer on the capacitor dielectric layer, wherein the second doped polysilicon layer fills the capacitor deep trench and acts as a capacitor top electrode;

a deep ion well in the semiconductor substrate; and a passing gate insulation (PGI) layer on the second doped polysilicon layer and on the STI structure.

12. The trench capacitor structure according to claim 11 wherein the PGI layer only covers a portion of the second doped polysilicon layer.

13. The trench capacitor structure according to claim 11 further comprising a silicide layer for electrically connecting the second doped polysilicon layer with a drain doping region of a transistor.

14. The trench capacitor structure according to claim 11 wherein the collar oxide layer has a thickness of about 100~150 angstroms.

15. The trench capacitor structure according to claim 11 further comprising a nitride layer at the bottom of the capacitor deep trench.

16. The trench capacitor structure according to claim 15 wherein the nitride layer has a thickness of 5~10 angstroms.

17. The trench capacitor structure according to claim 11 wherein the semiconductor substrate is a P type semiconductor substrate.

18. The trench capacitor structure according to claim 11 wherein the deep ion well is an N well.

19. The trench capacitor structure according to claim 11 wherein the capacitor dielectric layer comprises an oxide-nitride-oxide (ONO) dielectric layer.

* * * * *